(12) United States Patent
Fork et al.

(10) Patent No.: US 6,290,510 B1
(45) Date of Patent: Sep. 18, 2001

(54) SPRING STRUCTURE WITH SELF-ALIGNED RELEASE MATERIAL

(75) Inventors: David Kirtland Fork, Los Altos; Jackson Ho, Palo Alto; Rachel King-ha Lau, San Jose; JengPing Lu, Mountain View, all of CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/626,936

(22) Filed: Jul. 27, 2000

(51) Int. Cl.[7] .................................................. H01R 9/09
(52) U.S. Cl. ......................................................... 439/81
(58) Field of Search ............................. 439/81; 174/260, 174/259; 324/754

(56) References Cited

U.S. PATENT DOCUMENTS

| | | |
|---|---|---|
| 3,842,189 | 10/1974 | Southgate . |
| 4,423,401 | * 12/1983 | Mueller ................................. 337/107 |
| 5,280,139 | * 1/1994 | Suppelsa ............................... 174/260 |
| 5,613,861 | 3/1997 | Smith et al. . |
| 5,665,648 | 9/1997 | Little . |
| 5,944,537 | * 8/1999 | Smith et al. ........................... 439/81 |
| 5,979,892 | * 11/1999 | Smith et al. .......................... 271/267 |

\* cited by examiner

*Primary Examiner*—Brian Sircus
*Assistant Examiner*—Phuong K T Dinh
(74) *Attorney, Agent, or Firm*—Bever, Hoffman & Harms, LLP; Patrick T. Bever (57) ABSTRACT

Efficient methods for lithographically fabricating spring structures onto a substrate containing contact pads or metal vias by forming both the spring metal and release material layers using a single mask. Specifically, a pad of release material is self-aligned to the spring metal finger using a photoresist mask or a plated metal pattern, or using lift-off processing techniques. A release mask is then used to release the spring metal finger while retaining a portion of the release material that secures the anchor portion of the spring metal finger to the substrate. When the release material is electrically conductive (e.g., titanium), this release material portion is positioned directly over the contact pad or metal via, and acts as a conduit to the spring metal finger in the completed spring structure. When the release material is non-conductive, a metal strap is formed to connect the spring metal finger to the contact pad or metal via, and also to further anchor the spring metal finger to the substrate.

16 Claims, 6 Drawing Sheets

SPRING STRUCTURE WITH SELF-ALIGNED RELEASE MATERIAL

FIELD OF THE INVENTION

This invention generally relates to photolithographically patterned spring structures for use in probe cards, for electrically bonding integrated circuits, circuit boards, and electrode arrays, and for producing other devices such as inductors, variable capacitors, and actuated mirrors.

DISCUSSION OF RELATED ART

Photolithographically patterned spring structures have been developed, for example, to produce low cost probe cards, and to provide electrical connections between integrated circuits. A typical spring structure includes a spring metal finger having an anchor portion secured to a substrate, and a free portion initially formed on a pad of release material. The spring metal finger is fabricated such that its lower portions have a higher internal tensile stress than its upper portions, thereby producing an internal stress gradient that causes the spring metal finger to bend away from the substrate when the release material is etched. The internal stress gradient is produced by layering different metals having the desired stress characteristics, or using a single metal by altering the fabrication parameters.

Figure 1A:
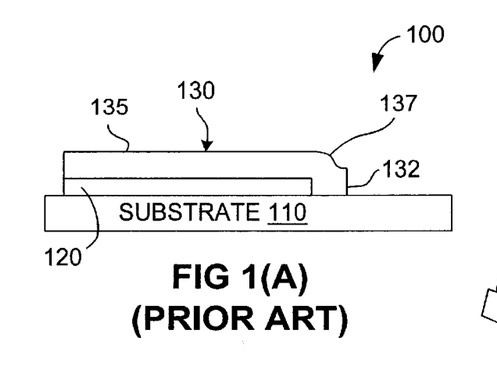
FIGS. 1(A) and 1(B) are side elevation views showing a first conventional spring structure.
Figure 1B:
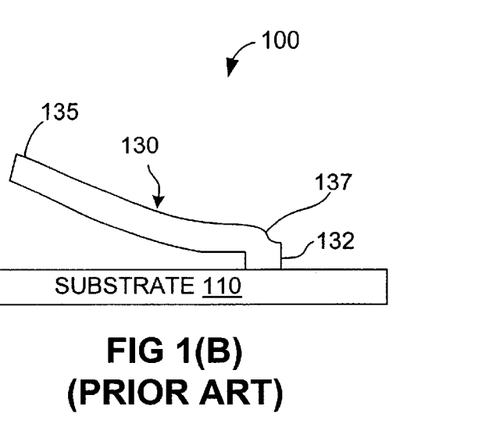

FIGS. 1(A) and 1(B) show a simplified conventional spring structure 100 consistent with that disclosed in U.S. Pat. No. 3,842,189 (Southgate). Referring to FIG. 1(A), spring structure 100 is produced by patterning a release material 120 on a substrate 110, and then forming a spring metal finger 130 that has an anchor portion 132 contacting substrate 110 and a free portion 135 extending over release material 120. FIG. 1(B) shows spring structure 100 when release material is removed and spring metal finger 130 bends away from substrate 110.

A problem associated with spring structure 100 is that formation of spring metal finger 120 over the step structure formed by release material 120 on substrate 100 produces a knee 137 in anchor portion 135. Knee 137 locally weakens the mechanical structure, thereby increasing the likelihood of breakage.

More recently developed spring structures avoid the problems described above by providing a continuous and planar release layer upon which both the free portion and the anchor portion of a spring metal finger is formed. This arrangement reduces the tendency to form a knee at the anchor portion of the spring metal finger. The contact pads, if composed of a conductive material, also serve to provide a conductive connection between the spring metal fingers and other circuitry formed on a substrate.

Figure 2A:
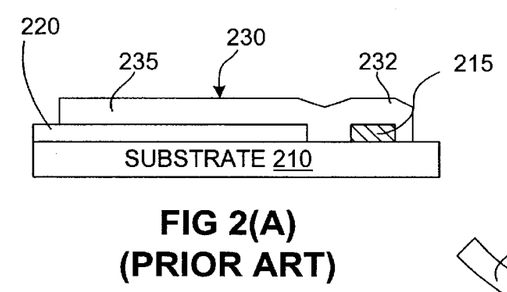
FIGS. 2(A) and 2(B) are side elevation views showing a second conventional spring structure.
Figure 2B:
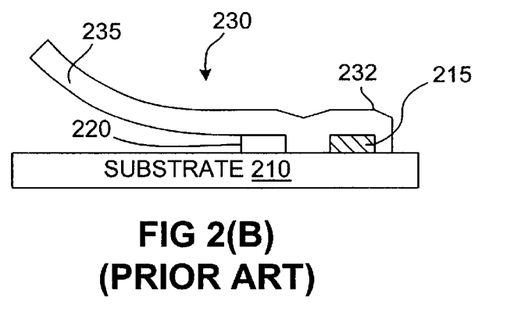

FIGS. 2(A) and 2(B) show a simplified spring structure 100 that is disclosed in U.S. Pat. No. 5,613,861 (Smith). Referring to FIG. 2(A), spring structure 200 is produced by patterning a release material 220 on a substrate 210 along with a metal contact pad 215, and then forming a spring metal finger 230 that has an anchor portion 232 formed on contact pad 215, and a free portion 235 extending over release material 220. Subsequently, as indicated in FIG. 2(B), release material 220 is removed, and free portion 235 of spring metal finger 230 bends away from substrate 210.

A problem with conventional spring structure 200, described above, is that separate masking steps are required to form release material 220 and spring metal finger 230. Specifically, because anchor portion 232 of spring metal finger 230 is connected to contact pad 215, a release material 220 must be masked and etched to provide an opening through which this connection is made. However, this separate masking step is costly—both for mask generation, and for additional process lithography.

Another recently developed spring structure is disclosed in U.S. Pat. No. 5,665,648 (Little). Little discloses a spring structure similar to that shown in FIGS. 2(A) and 2(B), but teaches the use of a conductive (i.e., TiW) release material, instead of the non-conductive (e.g., SiN) material taught in Smith. One problem with the structure disclosed by Little is that, similar to Smith, separate masking steps are required for the release material and the spring metal finger.

What is needed is a method for fabricating spring structures that avoids the formation of knees (see discussion above directed to Southgate) and minimizes the spacing required between adjacent spring metal fingers, thereby maximizing the width and contact force of each spring metal finger after bending. What is also needed is a method for fabricating spring structures that minimizes fabrication costs by eliminating one or more masks.

SUMMARY OF THE INVENTION

The present invention is directed to efficient methods for fabricating spring structures, and the spring structures formed by the methods.

In accordance with first, second, and third disclosed embodiments, the fabrication of a spring structure includes sequentially forming a release material layer and a spring metal layer on a substrate, and then etching portions of these layers to form a spring metal island positioned on a pad of the release material. The spring metal layer is fabricated using known techniques to include internal stress variants that are later used to form a spring metal finger. According to an aspect of the present invention, both the spring metal layer and the release material layer are etched using a single mask (e.g., photoresist or plated metal), thereby reducing fabrication costs by avoiding the separate masking steps utilized in conventional methods. Etching the release layer in this manner is tricky, however, because the release material is designed to release the spring metal from the substrate when removed. According to another aspect of the present invention, premature release of the spring metal finger is prevented by etching the release material such that the release material pad is self-aligned to the spring metal island. After the self-aligned release material pad is formed under each spring metal finger, the release material is removed from beneath a free end of the spring metal island using a release mask is formed over the anchor portion of the spring metal island, leaving a free end of each spring metal island exposed through a release window. With the release material removed from beneath the free end, the internal stress variants cause the spring metal finger to bend relative to the substrate.

According to another aspect of the present invention, the spring metal finger is either etched using the same etching process used to self-align the release material, or etched using a separate etching process. In one embodiment, both the spring metal layer and the release material layer are anisotropically dry etched. In an alternative embodiment, a separate wet etching process is performed to etch the spring metal layer before an isotropic dry etching process is used to form the self-aligned release material pads.

In accordance with a fourth disclosed embodiment of the present invention, self-alignment of the release material pad to the spring metal island is achieved using a lift-off fabrication process during which both the release material pad to the spring metal island are deposited through an opening formed in a single mask. Portions of spring metal and release material deposited on the mask are then removed along with the mask, thereby leaving the spring metal island and the release material pad. Subsequent processing is essentially the same as that used in the first through third embodiments.

Spring structures fabricated in accordance with the various disclosed methods include spring metal fingers that are secured by portions of the release material to an underlying substrate. Specifically, an anchor portion of each spring metal finger is entirely formed on a portion of release material that is self-aligned to the anchor portion, so the release materials utilized in accordance with the present invention serve both the conventional function of releasing a free end of the spring metal finger, and also serve to secure the anchor portion of the spring metal finger to the substrate. As mentioned above, in order to eliminate a separate release layer masking step, the spring metal layer is formed directly on the release material layer, so the anchor portion of the spring metal finger is necessarily entirely formed on a portion of the release material. After release, that is protected by the release mask during the release operation.

Release materials used in accordance with the present invention are either conductive, or non-conductive (electrically insulating).

In addition to their release and adherence functions, conductive release layer materials (e.g., one or more of Ti, Cu, Al, Ni, Zr, Co, or heavily doped Si) further serves to conduct electric signals between the spring metal finger and contact pads formed on the substrate directly beneath the anchor portion of the spring metal finger. A portion of the conductive release material adhering the anchor portion of the spring metal finger is formed directly over the contact pad or metal via, and the adhering portion of release material acts as an electrical conduit between the contact pad/via and the spring metal finger. Note that self-alignment of the conductive release material (particularly under the anchor portion of the spring metal finger) substantially reduces the spacing required between adjacent spring metal fingers in comparison to conventional methods using separate release material masking steps, thereby facilitating spring metal fingers that are wider and, hence, stronger, and capable of applying more force.

When the release material is non-conductive (e.g., silicon nitride), the anchor portion of the spring metal finger is located adjacent to, but not over, the contact pad or metal via. In addition, the spring structure further includes a metal strap extending from the contact pad to the anchor portion of the spring metal finger. The metal strap serves both to provide electrical connection to the contact pad, and to further anchor the spring metal finger to the substrate.

The various aspects of the present invention eliminate the need for a separate masking step to pattern the release layer. The present invention also reduces the need for additional substrate metallization to lower the trace resistance in probe card and other applications of the spring structures. Further, by providing an efficient method for using conductive release materials that have substantially greater adherence to the anchor portion of each spring structure, such as titanium, the present invention facilitates a critical 3× increase in spring thickness, and hence a roughly 9× increase in contact force.

BRIEF DESCRIPTION OF THE DRAWINGS

The advantages, features and design of the invention will become apparent from the following detailed description of the invention and the accompanying drawings in which like reference numerals refer to like elements and in which:

FIGS. 7(A) through 7(G) are cross-sectional side views illustrating a method for fabricating a spring structure according to a fourth embodiment of the present invention;

DETAILED DESCRIPTION

The present invention is directed to a spring structure that is fabricated such that the release material is self-aligned to the spring metal finger, and the spring metal finger is attached to an underlying substrate by the release material. Self-alignment of the release material to the spring metal finger minimizes spacing between adjacent spring structures, thereby facilitating wider and stronger spring structures. In addition, self-alignment is achieved by forming (i.e., either etching or patterning using a lift-off process) both the spring metal finger and the underlying self-aligned release material using a common mask, thereby reducing fabrication costs by eliminating a separate release material mask (which is used in the conventional methods described above).

As described in the embodiments provided below, self-alignment of the release material is beneficial both when the release material is electrically conductive, and when the release material is electrically non-conductive. Specifically, a first embodiment of the present invention utilizing a conductive release material is described below with reference to FIGS. 3(A) through 3(G), and a second embodiment of the present invention utilizing a non-conductive release material is described below with reference to FIGS. 5(A) through 5(G).

In addition, self-alignment can be achieved using several fabrication techniques. For example, a photoresist mask is utilized in the first and second embodiments (mentioned above) to etch both the spring metal and the release material. In a third embodiment, described with reference to FIGS. 6(A) through 6(H), this etching step is performed using plated metal as the spring metal mask. In yet a fourth embodiment, described with reference to FIGS. 7(A) through 7(G), self-alignment of the release material to the spring metal is achieved using a lift-off process.

Various additional aspects of the present invention are described with reference to the disclosed embodiments.

Conductive Release Material

FIGS. 3(A) through 3(G) are directed to a first embodiment of the present invention in which the self-aligned release material is conductive.

Figure 3A:
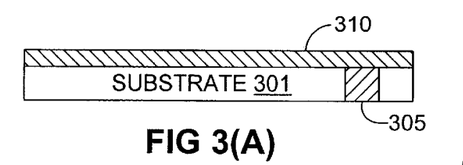
FIGS. 3(A) through 3(G) are cross-sectional side views illustrating a method for fabricating a spring structure according to a first embodiment of the present invention.

Referring to FIG. 3(A), the fabrication method begins with the formation of a conductive release material layer 310 over a glass substrate 301 that includes a contact pad or metal via ("contact pad") 305. In one embodiment, release material layer 310 is titanium that is sputter deposited onto substrate 310 to a thickness of approximately 50 nm or greater. Titanium provides desirable characteristics as a release material layer due to its plasticity (i.e., its resistance to cracking). Other release materials having the beneficial plastic characteristics of titanium may also be used. In other embodiments, release material layer 310 includes another metal, such as Copper (Cu), Aluminum (Al), Nickel (Ni), Zirconium (Zr), or Cobalt (Co). Release material layer 310 may also be formed using heavily doped silicon (Si). Further, two or more release material layers can be sequentially deposited to form a multi-layer structure. In yet another possible embodiment, any of the above-mentioned release materials can be sandwiched between two non-release material layers (i.e., materials that are not removed during the spring metal release process, described below).

Figure 3B:
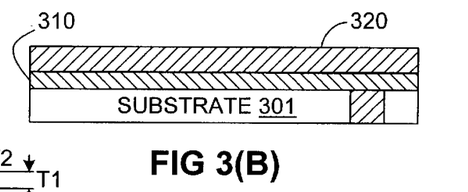

FIG. 3(B) shows a spring metal layer 320 formed on release material layer 310 using know processing techniques such that it includes internal stress variations in the growth direction. For example, in one embodiment, spring metal layer 320 is formed such that its lowermost portions (i.e., adjacent to release material layer 310) has a higher internal tensile stress than an upper portion of spring metal layer 320, thereby causing spring metal layer 320 to have internal stress variations that cause a spring metal finger to bend upward away from substrate 301 (discussed below). Methods for generating such internal stress variations in spring metal layer 320 are taught, for example, in U.S. Pat. No. 3,842,189 (depositing two metals having different internal stresses) and U.S. Pat. No. 5,613,861 (e.g., single metal sputtered while varying process parameters), both of which being incorporated herein by reference. In one embodiment, which utilizes a 100 nm Ti release material layer, spring metal layer 320 includes MoCr sputter deposited to a thickness of 3 microns. In other embodiments, an Mo spring metal layer can be formed on Si or Ti release material layers.

Note that spring metal layer 320 is separated from contact pad 305 by release material layer 310. Accordingly, a separate masking step utilized in conventional fabrication methods to form an opening in the release material is not required, thereby reducing fabrication costs. Instead, as discussed below, the present embodiment utilizes the conductivity of release material layer 320 to provide electrical connection between contact pad 305 and spring metal layer 320.

Figure 3C:
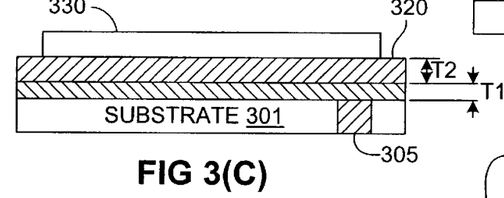

Referring to FIG. 3(C), an elongated spring metal mask 330 (e.g., photoresist) is then patterned over a selected portion of spring metal layer 320. Note that in accordance with the first embodiment, spring metal mask 330 extends over contact pad 305.

Figure 3D:
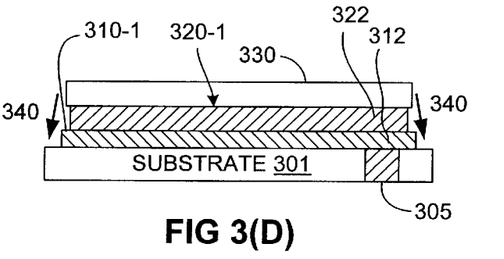

Next, as indicated in FIG. 3(D), exposed portions of spring metal layer 320 and underlying portions of release material layer 310 surrounding the spring metal mask 330 are etched using one or more etchants 340 to form a spring metal island 320-1 mounted on a release material pad 310-1 (as discussed below, a portion of spring metal island 320-1 is subsequently released to form a spring metal finger). According to an aspect of the present invention, the exposed portions of release material layer 310 are etched such that release material pad 310-1 is self-aligned to spring metal island 320-1. In one embodiment, an anisotropic etching process is used that avoids undercutting spring metal island 320-1, typically forming release material pad 310-1 such that it forms a skirt or "halo" of release material that extends out from the outer edge of spring metal island 320-1. In other embodiments, isotropic etching can be used provided removal of release material located under spring metal island 320-1 is minimized, particularly in a portion 312 that is located under an anchor portion 322 of spring metal island 320-1. Accordingly, premature release of spring metal island 320-1 is reliably avoided, which is particularly important in anchor portion 322.

The etching step depicted in FIG. 3(D) can be separated into two stages: a first stage during which the exposed portions of the spring metal layer are etched to form spring metal island 320-1, and a second stage during which the release material layer is etched to form release material pad 310-1. In one embodiment, the first stage may be performed using, for example, a wet etching process to remove exposed portions of the spring metal layer, and then anisotropically dry etching the underlying release material. This embodiment was successfully performed using cerric ammonium nitrate solution to remove a MoCr spring metal layer, and then underlying Ti release material was anisotropically dry etched using a reactive gas (e.g., fluorine) in a parallel plate plasma etcher. In another embodiment, anisotropic dry etching is used to etch both the spring metal layer and the underlying release material. This embodiment may be performed, for example, with Mo spring metal, and Si or Ti release layers. Mo, Si and Ti all etch in reactive fluorine plasmas. An advantage of dry etching the spring metal is that it facilitates finer features and sharper tipped spring metal fingers. Materials that do not etch in reactive plasmas may still be etched anisotropically by physical ion etching methods, such as argon ion milling. In another possible embodiment, a Ti release layer can be wet etches using a very dilute HF (e.g., approximately 200:1) buffered oxide etch to minimize the Ti undercut to a tolerable level. In yet another possible embodiment, one or both of the etching stages can be performed using the electrochemical etching process described in IBM J. Res. Dev. Vol. 42, No. 5, page 655 (Sep. 5, 1998), which is incorporated herein by reference. Many additional process variations and material substitutions are therefore possible and the examples given are not intended to be limiting.

After spring metal island 320-1 and release material pad 310-1 are formed, spring metal mask 330 (FIG. 3(D)) is removed.

Figure 3E:
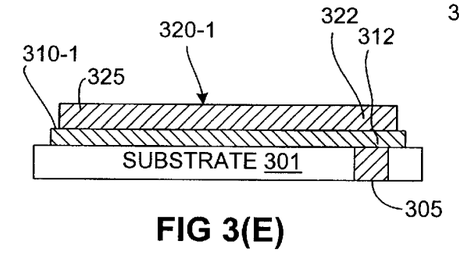

FIG. 3(E) shows spring metal island 320-1 and release material pad 310-1 after spring metal mask 330 (FIG. 3(D)) is removed. Note again that electrical connection between contact pad 305 and anchor portion 322 is provided through a portion 312 of release material pad 310-1, thereby allowing both the spring metal and release material to be etched using a single mask.

Figure 3F:
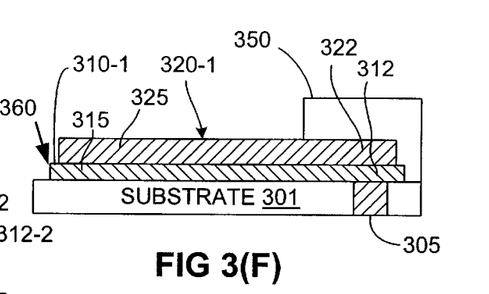

Referring to FIG. 3(F), a release mask 350 (e.g., photoresist) is then formed over anchor portion 322 and underlying portion 312 of release material pad 310-1. A release etchant 360 (e.g., a buffered oxide etch) is then use to selectively remove a first portion 315 of release material pad 310-1 from beneath a cantilever (free) portion 325 of spring metal finger 320-1, while underlying portion 312 is protected (retained) by release mask 350 so that anchor portion 322 remains secured to substrate 301.

Figure 3G:
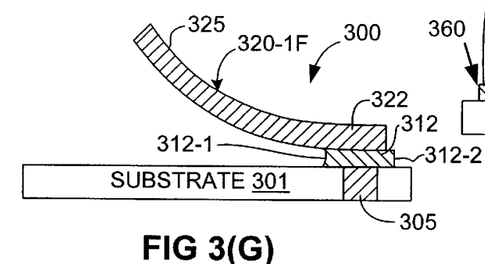

Referring to FIG. 3(G), as release material portion 315 is removed from under free portion 325, free portion 325 is released and a spring metal finger 320-1F bends away from substrate 301 due to the internal stress variations established during the formation of the spring metal layer (discussed above). In this manner, a spring structure 300 is fabricated that is secured and electrically coupled to contact pad 305 by conductive release material portion 312.

Note that anchor portion 322 remains attached to substrate 301 by release material portion 312, which is typically slightly undercut along an edge 312-1 during the release process, but remains self-aligned along three edges (e.g., a back edge 312-2) to anchor portion 322 due to protection by release mask 350 (see FIG. 3(F)) during the release process.

Figure 4:
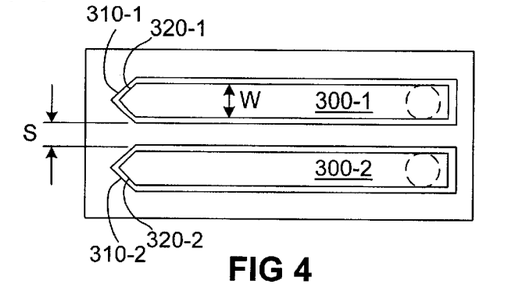
FIG. 4 is a plan view showing a pair of spring structures produced in accordance with the present invention.

FIG. 4 is a plan view showing two spring structures 300-1 and 300-2 that are partially fabricated side-by-side on a single substrate. This arrangement illustrates that a required space S is provided between release material pads 310-1 and 310-2 to prevent a short circuit between spring metal islands 320-1 and 320-2. Because release material pads 310-1 and 310-2 are self-aligned to spring metal islands 320-1 and 320-2, the required spacing S is much smaller than in conventional methods using separate masking steps to form release material pads. Accordingly, because the required space S can be minimized, the width W of spring metal islands 320-1 and 320-2 can be maximized, thereby facilitating the production of stronger spring metal fingers.

Referring back to FIG. 3(C), another benefit of the present invention is that the thickness Ti of release material layer 310 may be increased. The thickness of conventional release material layers has traditionally been approximately 100 nm. Because the present invention utilizes a portion of the conductive release material to facilitate electrical coupling between contact pad 305 and spring metal layer 320, it is advantageous to increase the thickness T1 to lower trace resistance. Increasing the release material layer thickness to several microns or more may be desired to reduce resistance.

Referring back to FIG. 3(G), a further aspect of the present invention is that in facilitating the use of metals for the release material through self-alignment to the spring metal finger, a new class of plastic (ductile) materials is enabled for release layer design. This is important because these ductile release materials oppose a primary mode of failure for the spring structures, namely crack propagation along the interface between the spring metal and the underlying release material (e.g., cracks starting edge 312-1 during the release process and extending toward back edge 312-2). As depicted by the curved face of edge 312-1, ductile release materials resist crack propagation by deforming plastically around the crack tip, thereby increasing the fracture strength. For highly ductile materials, the plastic deformation energy can be much larger than the surface free energy at the crack, thus greatly extending the material strength. To maximize the resistance to crack propagation, the surface free energies of the interfaces within and bounding the release layer and the plasticity need to be considered. If needed, a multi-layer sandwich structure such as Ti/Al/Ti can be used to provide both adherence and plasticity. Some polymers also experience plastic deformation, however their adhesion to metals is typically poorer than other metals.

The use of metal in release material layer 310, particularly titanium, also facilitates a thicker spring metal layer 320. The spring metal layer thickness T2 (FIG. 3(C)) produced on a conventional SiN release material layer is typically 1 to 1.5 microns. In a comparative experiment performed by the present inventors, a spring metal layer 320 including MoCr having a thickness of 3 microns and a stress gradient of ~2 GPa delaminated within minutes of deposition on a conventional SiN release material layer. However, the same spring metal layer proved stable and well adhered to a Ti release material layer, and to a less extent a Si release material layer. Because the contact force scales quadratically with spring metal thickness, this process extension permits much higher contact force, and hence finer pitch scalability, and improved device reliability.

Various aspects and benefits associated with self-aligning the release material to the spring metal finger of a spring structure have been described above with reference to conductive release materials. However, many of the benefits associated with the present invention (e.g., reduced fabrication costs by reducing the number of required masks) are realized in embodiments incorporating non-conductive release materials, one of which is described below with reference to FIGS. 5(A) through 5(G).

Non-Conductive Release Material

FIGS. 5(A) through 5(G) are directed to a second embodiment of the present invention in which the self-aligned release material is non-conductive (i.e., electrically insulating).

Figure 5A:
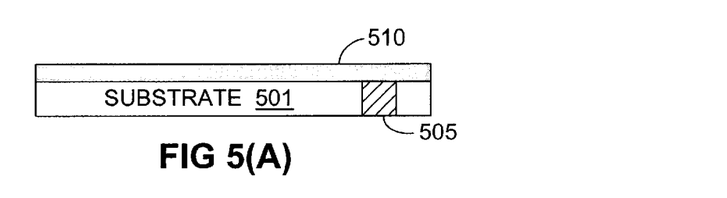
FIGS. 5(A) through 5(G) are cross-sectional side views illustrating a method for fabricating a spring structure according to a second embodiment of the present invention.
Figure 5B:
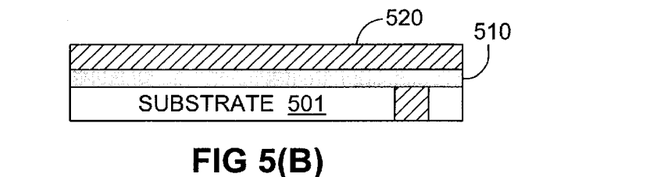

Referring to FIG. 5(A), a non-conductive release material layer 510 (e.g., SiN) is formed over a substrate 501 including a contact pad 505. Note that release material layer 510 is again formed over contact pad 505. A spring metal layer 520 is then formed on release material layer 510 in the manner described above (FIG. 5(B)).

Figure 5C:
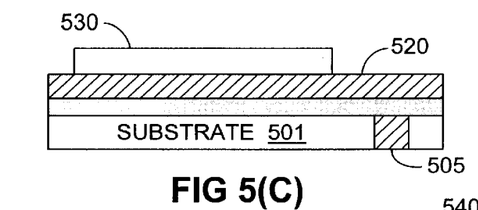

FIG. 5(C) shows a spring metal mask 530 that is patterned over spring metal layer 520. Note that, unlike mask 330 (see FIG. 3(C)), spring metal mask 530 is patterned such that a portion of spring metal layer 520 located over contact pad 505 is exposed such that, after etching (shown in FIG. 5(D)), contact pad 505 is exposed on an upper surface of substrate 501. Clearing release material from over contact pad 505 is necessary when non-conductive release materials (e.g., SiN) are used, or poorly conducting release materials (e.g., undoped Si) are used. In the poorly conducting case, it is also necessary to clear the release material between adjacent spring metal fingers (as described above with reference to conductive release materials).

Figure 5D:
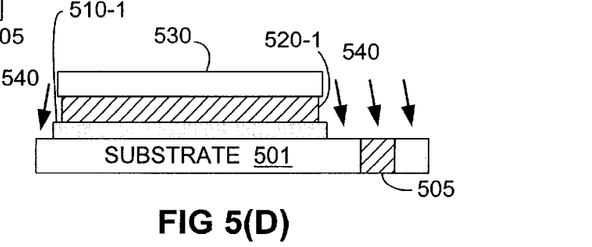

The etching step shown in FIG. 5(D) is performed in a manner similar to that described above with reference to FIG. 3(D). In one embodiment, anisotropic etching 540 is used to form a self-aligned release material pad 510-1 under a spring metal island 520-1.

Figure 5E:
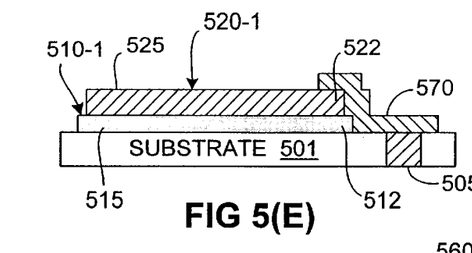
Figure 5F:
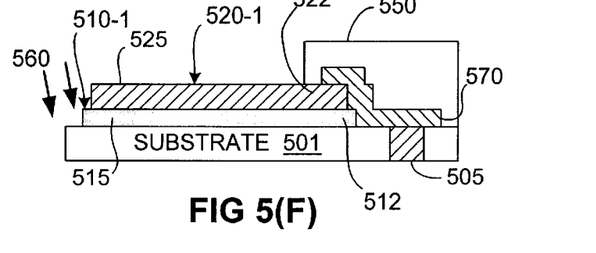
Figure 5G:
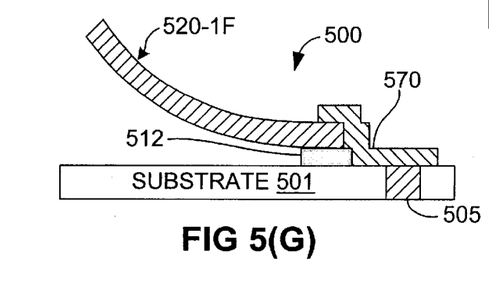

Next, a metal strap 570 (e.g., copper or aluminum) is formed using known techniques to electrically connect spring metal island 520-1 to contact pad 505 (FIG. 5(E)). Metal strap 570 may also be used to further anchor spring metal finger 520-1. Yet another optional function of metal strap 570 is use as a release mask during the subsequent selective removal of release material portion 515 from under free portion 525 to produce spring metal finger 520-1F (FIG. 5(G)). Alternatively, an additional release mask 550 may be utilized in the manner described above with reference to FIG. 3(F). In either case, spring structure 500 includes a retained portion 512 of release material pad 510-1 that is located under anchor portion 522 of bent spring metal finger 520-1F.

Plate Metal Mask Processing

FIGS. 6(A) through 6(H) show process steps associated with the fabrication of a spring structure in accordance with a third embodiment of the present invention. The third embodiment is similar to the first and second embodiments, but differs in that plated metal is patterned on the spring metal layer to serve as a spring metal/release material mask (i.e., both the spring metal island and the underlying release material pad are self-aligned to the patterned plated metal).

Portions of the plated metal remain on the non-released spring metal to produce spring structures in which the spring metal fingers are integrally formed with highly conductive flat traces. These spring structures are particularly useful for flip-chip packages and probes.

Figure 6A:
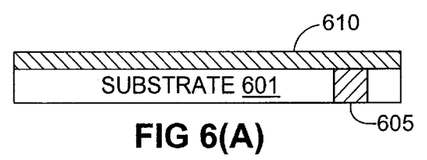
FIGS. 6(A) through 6(H) are cross-sectional side views illustrating a method for fabricating a spring structure according to a third embodiment of the present invention.
Figure 6B:
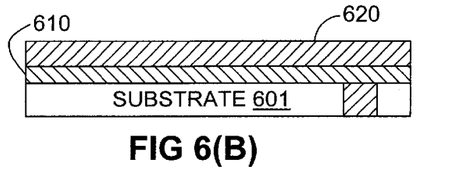
Figure 6C:
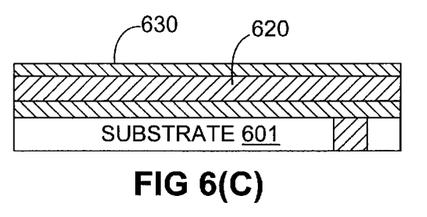
Figure 6D:
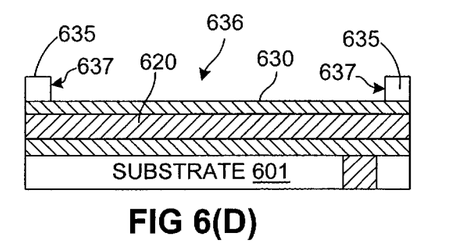
Figure 6E:
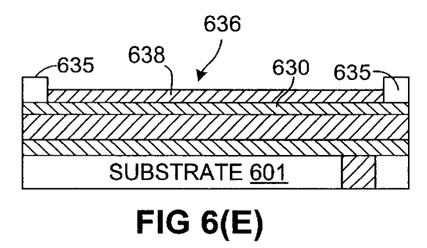

The fabrication method according to the third embodiment begins in a manner similar to the first and second embodiments (discussed above) in that a release material layer 610 is formed over a substrate 601 that includes a contact pad 605 (FIG. 6(A)), and then a spring metal layer 620 is formed on release material layer 610 (FIG. 6(B)). Release material layer 610 can be conductive, as described above with reference to the first embodiment, or non-conductive, as described above with reference to the second embodiment. The present example depicts the use of conductive release materials are used—if non-conductive release materials are used, a metal strap must be included that is formed in the manner described above with reference to FIGS. 5(D) and 5(E).

Plated metal is then patterned on spring metal layer 620 as follows. First, an optional passivation metal layer 630 is deposited on spring metal layer 620 (FIG. 6(C)). Passivation metal layer 630 (e.g., Au, Pt, Pd, or Rh) is provided as a seed material for the subsequent plating process if spring metal layer 620 does not serve as a good base metal. Passivation metal layer 630 may also be provided to improve contact resistance in the completed spring structure. Next, a resist pattern (mask) 635 is formed over spring metal layer 620 (i.e., on passivation metal layer 630, if used) that has an opening 636 whose edge 637 is in the shape of the spring metal island to be formed (FIG. 6(D)). A plated metal pattern 638, such as nickel, is then formed using a known plating process through opening 636 on the exposed portion of passivation metal layer 630 (FIG. 6(E)). Plated metal structure 638 may comprise more than one type of metal. The plating process can be electroless, but is preferably electroplating, using the previously deposited metal (i.e., passivation metal layer 630 and/or spring metal layer 620) as the cathode. Resist pattern 635 is then removed.

Figure 6F:
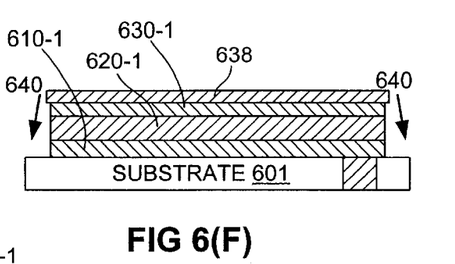

In accordance with the third embodiment, plated metal structure 638 serves in place of spring metal masks 330 and 530 (see FIGS. 3(D) and 5(D)) during the etching of the spring metal layer and the release material layer. FIG. 6(F) shows the use of an etchant 640 to form a passivation metal portion 630-1 (if present), a spring metal island 620-1, and a release material pad 610-1, all being self-aligned to plated metal pattern 638, which is used as a mask.

Figure 6G:
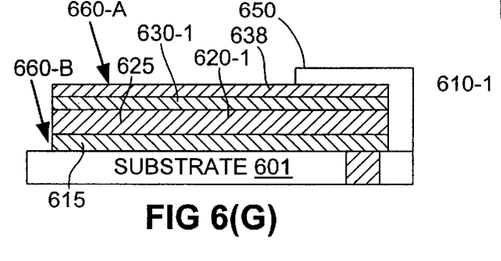

Referring to FIG. 6(G), once etching is completed, a release mask 650 is applied in the manner described in the above embodiments. During the subsequent release etch, all or part of plated metal structure 638 exposed within the release window is selectively etched using a suitable etchant 660-A that does not remove free portion 622 of spring metal island 620-1. Release material portion 615 is also removed using an etchant 660-B, which either can be the same as or different from etchant 660-A. If desired, the release window can then be stripped, or may be retained as passivation. The latter may be preferred if it is a material such as polyimide.

Figure 6H:
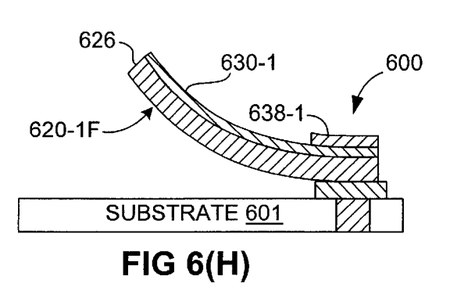

The resulting spring structure 600 is shown in FIG. 6(H). Note that some of passivation metal portion 630-1 (or plating metal if no passivation metal is used) is optionally retained on spring metal finger 620-1F to improve electrical conduction and/or improve contact resistance. In addition, portions 638-1 of the plated metal are retained on all spring metal that remains secured to the substrate, thereby improving electrical conductance. Note also that the side edges of anchor portion 622 (and underlying release material portion 612) are self-aligned to plated material portion 638-1.

The choice of plating material is dependent on its selective etchability compared to spring metal island. However, because the thickness of the plated metal pattern (a few microns) would be much greater compared to the spring metal layer (less than 2 microns), any etching that might occur on the plated metal pattern would be negligible. An example that is possible using selective etchants is a plated Ni pattern on a Au/MoCr/Ti spring metal layer. In this embodiment, examples of wet etchants that can be used are: NaOH-KFCN for the MoCr, KI for the Au, HF for the Ti, and HCl for the final removal of the Ni.

In an alternative embodiment, plated metal patterns may be used that can be removed by lift-off processing (which is described below with reference to the fourth embodiment), rather than by etching. In this case the same masking steps (described above) are used, but an additional, sacrificial metal is deposited prior to plating. An example of the plated metal is a passive metal such as Rh, which is difficult to etch chemically. The sacrificial layer can be a thin layer of Ni which can be removed by HCl without affecting the spring metal island.

Lift-Off Processing

FIGS. 7(A) through 7(G) are directed to a fourth embodiment of the present invention in which self-alignment of the release material is produced by lift-off processing techniques. Accordingly, the fourth embodiment illustrates a spring structure having self-aligned release material that is fabricated without forming continuous spring metal and release material layers and without etching using a single spring metal mask, which are used in the first through third embodiments (described above).

Figure 7A:
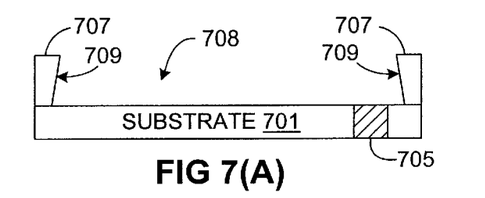

Referring to FIG. 7(A), a lift-off (first) mask 707 is formed such that an opening 708 is defined by edges 709 that exposes a portion of substrate 701 including a contact pad 705. In one embodiment, lift-off mask 707 is formed by depositing photoresist, and then patterning is performed such that edges 709 of photoresist are undercut (as depicted by the slight slope of edges 709 shown in FIG. 7(A)).

Figure 7B:
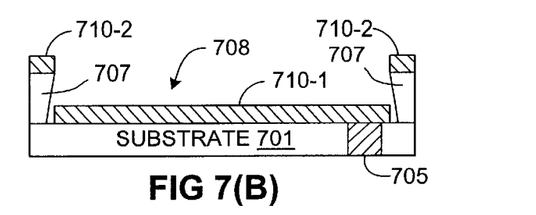

Referring to FIG. 7(B), release material is then deposited (e.g., sputtered) over substrate 701. Some of the deposited release material passes through opening 708 and forms a release material pad 710-1 on the exposed portion of substrate 701. Second portions 710-2 of the release material are formed on the upper surface of lift-off mask 707. Note that a portion of release material pad 710-1 is formed on contact pad 705.

Figure 7C:
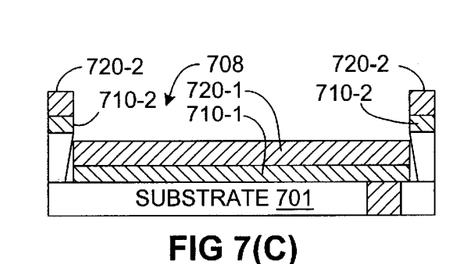

Referring to FIG. 7(C), spring metal is then formed onto the release material such that a spring metal island 720-1 is formed on release material pad 710-1, and second portions 720-2 of the spring metal are formed on second portions 710-2 of the release material. Consistent with the description provided above, spring metal island 720-1 is formed to produce internal stress variations in the growth direction.

Figure 7D:
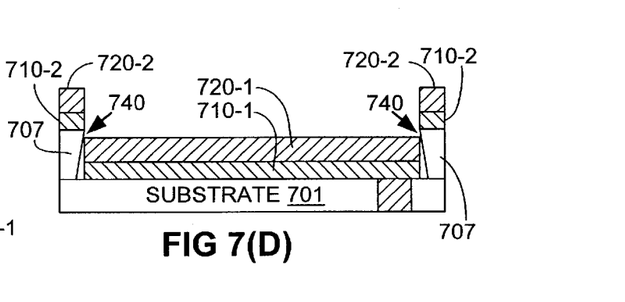

FIG. 7(D) illustrates a subsequent lift-off etching process during which a suitable etchant 740 is used to remove mask 707, thereby "lifting off" second portions 710-2 and 720-2 that are formed thereon. This lift-off etching process is performed using known techniques.

Figure 7E:
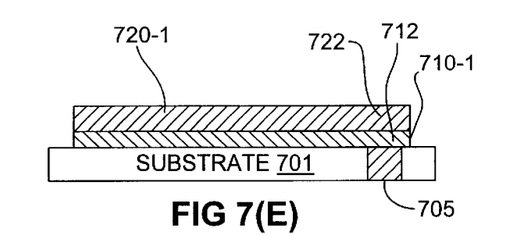
Figure 7G:
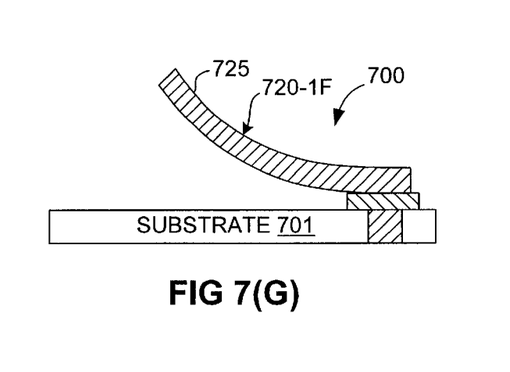

FIG. 7(E) shows release material pad 710-1 and spring metal island 720-1 after lift-off processing. The present example depicts the use of conductive release materials are used, so that a portion 712 of release material pad 710-1 provides an electrical connection between anchor portion 722 of spring metal island 720-1 and contact pad 705. Conversely, if non-conductive release materials are used, these portions must be removed and a metal strap formed in the manner described above with reference to FIGS. 5(D) and 5(E).

The present embodiment proceeds from the point indicated in FIG. 7(E) with processing steps that are essentially identical to those described above with the first through third embodiments. Specifically, a release mask 750 is formed over anchor portion 722 of spring metal island 720-1 and portion 712 of release material pad 710-1, and exposed portion 715 of release material pad 710-1 is selectively removed using a suitable etchant 760 (FIG. 7(F)), thereby releasing free portion 725, which bends upward relative to substrate 701 due to the internal stress variations to form a spring metal finger 720-1F (FIG. 7(G)). The resulting spring structure 700 is thus essentially identical to that produced by the embodiments described above, and provides essentially the same benefits.

Although the invention has been described in connection with the present embodiments, it is understood that this invention is not limited to the embodiments disclosed, but is capable of various modifications that would be apparent to a person skilled in the art. For example, although the release material layers are illustrated as being formed directly on a substrate in the disclosed embodiments, one or more additional metal layers may be formed between the release material layer and the substrate. Examples of these additional metal layers are illustrated with reference to the alternative embodiments, described below.

Figure 8A:
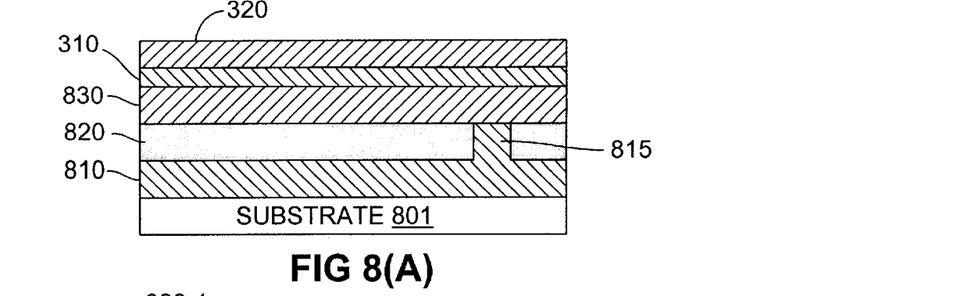
FIGS. 8(A) through 8(C) are cross-sectional side views illustrating a method for fabricating a spring structure according to an alternative embodiment of the present invention.
Figure 8B:
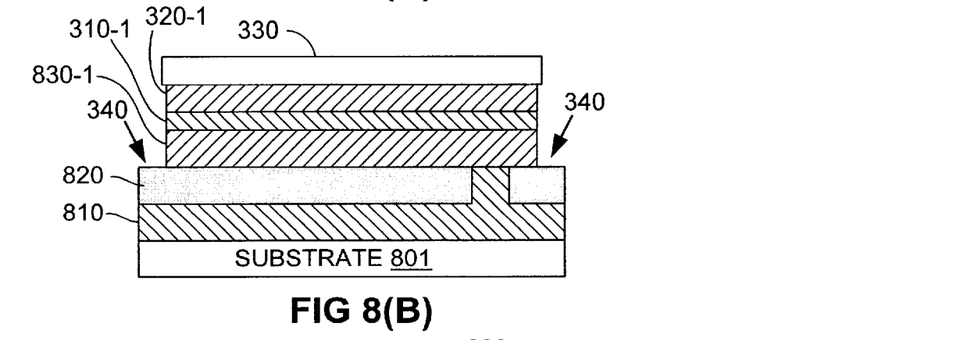
Figure 8C:
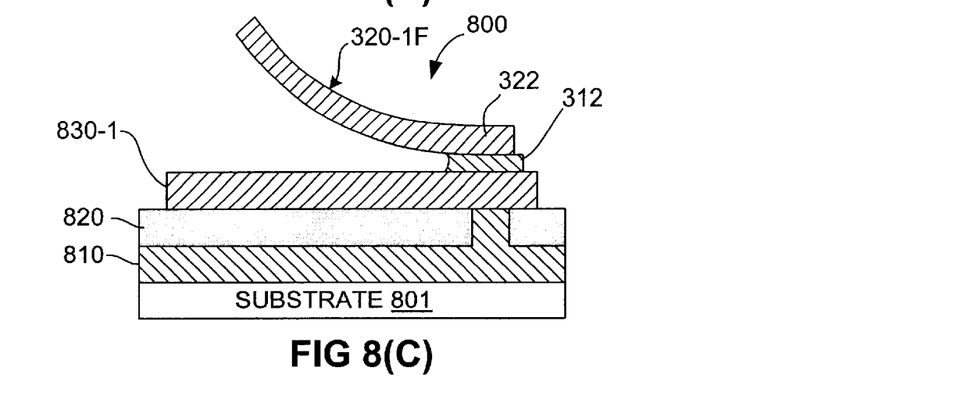

FIGS. 8(A) through 8(C) show the fabrication of a spring structure according to an alternative embodiment. FIG. 8(A) shows an early stage in which a sub-metal wiring pattern 810 is formed on a substrate 810, and is connected by a metal via 815 (which extends through a dielectric layer 820) to a second metal layer 830. Release material layer 310 and spring metal layer 320, which are described above with reference to the first embodiment, are then formed on second metal layer 830. FIG. 8(B) illustrates a subsequent etching step during which spring metal mask 330 is utilized to form spring metal island 320-1 and self-aligned release material pad 310-1 in the manner described above. Note that spring metal mask 330 is also used to etch the second metal layer, thereby forming a conductor 830-1 that is also self-aligned to spring metal island 320-1. FIG. 8(C) shows a spring structure 800 formed after the release of spring metal finger 320-1F. Conductor 830-1 is provided in place of plated metal (described above with reference to the fourth embodiment) to improve signal conductance to and from anchor portion 322 of spring metal finger 310-1F through release material portion 312. Note that conductor 830-1 extends under spring metal finger 320-1F in the disclosed embodiment—in other embodiments the portion of conductor 830-1 located under spring metal finger 320-1F can be removed during the release etch using known techniques.

Figure 9:
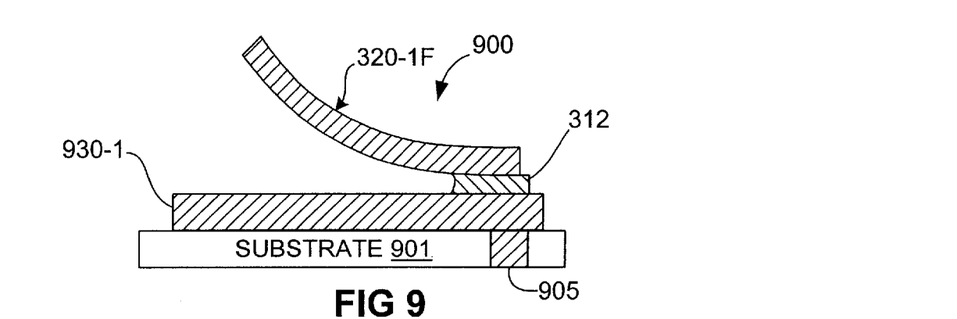
FIG. 9 is a cross-sectional side view illustrating a spring structure according to another alternative embodiment of the present invention.

FIG. 9 shows a spring structure 900 according to another alternative embodiment that includes an optional contact pad or metal via 905 formed in a substrate 901. Spring structure 900 is similar to spring structure 800 (see FIG. 8(C) in that it includes both a conductor 930-1 and a release material pad 310-1 that are self-aligned to a spring metal finger 320-1F. However, conductor 930-1 is formed directly on substrate 901, and provides electrical connection between spring metal finger 320-1F and, for example, contact pad 905 through release material portion 312. That is, a wiring pattern, such as wiring pattern 810 of spring structure 800, is omitted from spring structure 900.

The alternative embodiments described above provide examples of how the specific embodiments disclosed in FIGS. 3(A) through 7(G) can be modified from without departing from the spirit and scope of the present invention. Thus, the invention is limited only by the following claims.

We claim:

1. A spring structure comprising:

a substrate;

a conductive release material portion located over the substrate; and a spring metal finger having an anchor portion attached to the release material pad such that the release material portion is located between the anchor portion and the substrate, the spring metal finger also having a free portion extending over the substrate.

2. The spring structure according to claim 1, wherein the release material portion is electrically conductive.

3. The spring structure according to claim 1, wherein the release material portion comprises heavily doped silicon.

4. The spring structure according to claim 1, wherein the release material portion comprises at least one metal selected from the group consisting of Ti, Cu, Al, Ni, Zr, and Co.

5. The spring structure according to claim 1, wherein the release material portion comprises a multi-layer structure.

6. The spring structure according to claim 1, wherein a contact pad is provided on the substrate, wherein the release material portion is formed adjacent to the contact pad, and wherein the spring structure further comprises a metal strap electrically connecting the anchor portion of the spring metal finger to the contact pad.

7. The spring structure according to claim 1, further comprising a wiring pattern located between the release material portion and the substrate.

8. The spring structure according to claim 1, further comprising a conductor located between the release material portion and the substrate, wherein the conductor is also self-aligned to the spring metal finger.

9. The spring structure according to claim 8, further comprising:

a wiring pattern formed on the substrate;

a dielectric layer formed on the wiring pattern; and a metal via extending between the wiring pattern and the conductor through the dielectric layer.

10. The spring structure according to claim 8, further comprising a contact pad provided on the substrate, wherein the conductor is formed on an upper surface of the contact pad.

11. The spring structure according to claim 1, further comprising plated metal formed on the anchor portion of the spring metal finger, wherein the anchor portion is self-aligned to the plated metal.

12. The spring structure according to claim 11, further comprising a passivation metal formed between the plated metal and the anchor portion.

13. A spring structure comprising:

a substrate;

a release material portion located over the substrate; and a spring metal finger having an anchor portion attached to the release material pad such that the release material portion is located between the anchor portion and the substrate, the spring metal finger also having a free portion extending over the substrate, wherein a contact pad is provided on the substrate, wherein the release material portion is formed on the contact pad, wherein the anchor portion of the spring metal finger is separated from the contact pad by the release material portion, and wherein the release material portion comprises a conductive material arranged such that the spring metal finger is electrically connected to the contact pad by the release material portion.

14. The spring structure according to claim 13, wherein the release material portion comprises heavily doped silicon.

15. The spring structure according to claim 13, wherein the release material portion comprises at least one metal selected from the group consisting of Ti, Cu, Al, Ni, Zr, and Co.

16. The spring structure according to claim 13, wherein the release material portion comprises a multi-layer structure.

* * * * *

UNITED STATES PATENT AND TRADEMARK OFFICE
CERTIFICATE OF CORRECTION

PATENT NO.         : 6,290,510 B1                                              Page 1 of 1
APPLICATION NO. : 09/626936
DATED              : September 18, 2001
INVENTOR(S)        : David K. Fork et al.

It is certified that error appears in the above-identified patent and that said Letters Patent is hereby corrected as shown below:

Column 1, line 3, insert as a new paragraph:

This invention was made with Government support under 70NANB8H4008 awarded by NIST. The Government has certain rights in this invention.

Signed and Sealed this

Seventeenth Day of April, 2007

JON W. DUDAS
*Director of the United States Patent and Trademark Office*